US012749873B2

(12) United States Patent
Sugiyama et al.

(10) Patent No.: US 12,749,873 B2
(45) Date of Patent: Sep. 29, 2026

(54) QUANTUM CASCADE LASER ELEMENT AND QUANTUM CASCADE LASER DEVICE

(71) Applicant: HAMAMATSU PHOTONICS K.K., Hamamatsu (JP)

(72) Inventors: Atsushi Sugiyama, Hamamatsu (JP); Shinichi Furuta, Hamamatsu (JP); Tadataka Edamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 498 days.

(21) Appl. No.: 17/914,508

(22) PCT Filed: Mar. 25, 2021

(86) PCT No.: PCT/JP2021/012674
§ 371 (c)(1),
(2) Date: Sep. 26, 2022

(87) PCT Pub. No.: WO2021/200584
PCT Pub. Date: Oct. 7, 2021

(65) Prior Publication Data

US 2023/0130363 A1 Apr. 27, 2023

(30) Foreign Application Priority Data

Apr. 2, 2020 (JP) ................................ 2020-066860

(51) Int. Cl.
*H01S 5/34* (2006.01)
*H01S 5/12* (2021.01)

(52) U.S. Cl.
CPC .............. *H01S 5/3401* (2013.01); *H01S 5/12* (2013.01)

(58) Field of Classification Search
CPC ............................ H01S 5/3041; H01S 5/3042
See application file for complete search history.

(56) References Cited

U.S. PATENT DOCUMENTS

2013/0301667 A1* 11/2013 Sato .......................... H01S 5/22 372/44.01
2017/0373472 A1* 12/2017 Meyer .................. H01S 5/3422
(Continued)

FOREIGN PATENT DOCUMENTS

JP 2004-128279 A 4/2004
JP 2004-134770 A 4/2004
(Continued)

OTHER PUBLICATIONS

English translation of Hagino (Year: 2018).*
International Preliminary Report on Patentability mailed Oct. 13, 2022 for PCT/JP2021/012674.

*Primary Examiner* — Minsun O Harvey
(74) *Attorney, Agent, or Firm* — FAEGRE DRINKER BIDDLE & REATH LLP

(57) ABSTRACT

A quantum-cascade laser element includes: a semiconductor substrate; a semiconductor laminate formed on the semiconductor substrate to include a ridge portion configured to include an active layer having a quantum-cascade structure; an embedding layer including a first portion formed on a side surface of the ridge portion, and a second portion extending from an edge portion of the first portion on a side of the semiconductor substrate along a width direction of the semiconductor substrate; a metal layer formed on a top surface of the ridge portion, on the first portion, and on the second portion; and a dielectric layer disposed between the second portion and the metal layer. The dielectric layer is formed such that a part of the second portion is exposed from the dielectric layer. The metal layer is in contact with the second portion at the part.

14 Claims, 8 Drawing Sheets

(56) References Cited

U.S. PATENT DOCUMENTS

| | | | | |
|---|---|---|---|---|
| 2018/0166859 | A1* | 6/2018 | Hashimoto | H01S 5/3402 |
| 2021/0351570 | A1* | 11/2021 | Fujita | H01S 5/0425 |

FOREIGN PATENT DOCUMENTS

| | | | | |
|---|---|---|---|---|
| JP | 2009-004760 | A | | 1/2009 |
| JP | 2013-026230 | A | | 2/2013 |
| JP | 2018-098262 | A | | 6/2018 |
| JP | 2018137327 | A | * | 8/2018 |
| JP | 2019-004106 | A | | 1/2019 |
| JP | 2020-043206 | A | | 3/2020 |

* cited by examiner (a)

(b)

(a)

(b)

(a)

(b)

(a)

(b)

(a)

(b)

QUANTUM CASCADE LASER ELEMENT AND QUANTUM CASCADE LASER DEVICE

TECHNICAL FIELD

One aspect of the present disclosure relates to a quantum-cascade laser element and a quantum-cascade laser device.

BACKGROUND ART

A quantum-cascade laser element is known that includes a semiconductor substrate; a semiconductor laminate formed on the semiconductor substrate to include a ridge portion; a current block layer formed over the ridge portion and over the semiconductor substrate; an insulating layer formed on the current block layer; a metal layer formed on a top surface of the ridge portion and on the insulating layer (for example, refer to Patent Literature 1).

CITATION LIST

Patent Literature

Patent Literature 1: Japanese Unexamined Patent Publication No. 2018-98262

SUMMARY OF INVENTION

Technical Problem

In the above-described quantum-cascade laser element, in order to stably output light of a basic mode having a peak of intensity at a central portion of the ridge portion in a width direction, suppressing the oscillation of light of a high-order mode having a peak of intensity on both sides of the central portion is required. In addition, both an improvement in heat dissipation and an improvement in the stability of the laser element are required.

An object of one aspect of the present disclosure is to provide a quantum-cascade laser element and a quantum-cascade laser device capable of achieving an improvement in heat dissipation, the suppression of the oscillation of a high-order mode, and an improvement in stability as a laser element.

Solution to Problem

A quantum-cascade laser element according to one aspect of the present disclosure includes: a semiconductor substrate; a semiconductor laminate formed on the semiconductor substrate to include a ridge portion configured to include an active layer having a quantum-cascade structure; an embedding layer including a first portion formed on a side surface of the ridge portion, and a second portion extending from an edge portion of the first portion on a side of the semiconductor substrate along a width direction of the semiconductor substrate; a metal layer formed on a top surface of the ridge portion, on the first portion, and on the second portion, and a dielectric layer disposed between the second portion and the metal layer. The dielectric layer is formed such that a part of the second portion is exposed from the dielectric layer. The metal layer is in contact with the second portion at the part.

The quantum-cascade laser element is provided with the embedding layer including the first portion formed on the side surface of the ridge portion, and the second portion extending from the edge portion of the first portion on a side of the semiconductor substrate along the width direction of the semiconductor substrate. Accordingly, heat generated in the active layer can be effectively dissipated. In addition, the metal layer is formed on the first portion formed on the side surface of the ridge portion. Accordingly, the oscillation of a high-order mode can be suppressed while suppressing a loss in a basic mode. In addition, the dielectric layer is disposed between the second portion and the metal layer. Accordingly, bond strength between the metal layer and the embedding layer can be improved. As a result, the peeling or degradation of the metal layer can be suppressed, and the stability of the laser element can be improved. In addition, a part of the second portion is exposed from the dielectric layer, and the metal layer is contact with the second portion at the part. Accordingly, heat dissipation can be further improved. Therefore, according to the quantum-cascade laser element, an improvement in heat dissipation, the suppression of the oscillation of the high-order mode, and an improvement in stability can be achieved.

An opening that exposes an inner portion of the second portion from the dielectric layer may be formed in the dielectric layer, the inner portion being continuous with the first portion, and the metal layer may be in contact with the inner portion through the opening. In this case, since the metal layer is in contact with the second portion in an inner region close to the ridge portion, heat dissipation can be even further improved. On the other hand, the metal layer is firmly bonded to the second portion in an outer region far from the ridge portion, with the dielectric layer interposed therebetween. Since the metal layer is firmly bonded to the second portion in an outer region in which the peeling or the like of the metal layer is likely to occur, the peeling or the like of the metal layer can be effectively suppressed. In addition, there is a possibility that a cleavage streak is formed in the vicinity of an inner edge of the dielectric layer (inner edge of the opening) because of a cleavage process during manufacturing, but since the inner edge of the opening is separated from the ridge portion, the influence of the cleavage streak on a light output characteristic can be suppressed.

A width of the opening in the width direction of the semiconductor substrate may be more than or equal to two times a width of the active layer. In this case, a region in which the metal layer is in contact with the second portion can be widened, and heat dissipation can be even further improved. In addition, the influence of the cleavage streak on the light output characteristic can be further suppressed.

A width of the opening in the width direction of the semiconductor substrate may be more than or equal to ten times a thickness of the second portion. In this case, the region in which the metal layer is in contact with the second portion can be further widened, and heat dissipation can be even further improved. In addition, the influence of the cleavage streak on the light output characteristic can be further suppressed.

The quantum-cascade laser element according to one aspect of the present disclosure may further include a wire made of metal, that is electrically connected to the metal layer. A connection position between the metal layer and the wire may overlap the dielectric layer when viewed in a thickness direction of the semiconductor substrate. In this case, the occurrence of the peeling or the like of the metal layer caused by a tensile stress that the wire acts on the metal layer can be suppressed.

In a thickness direction of the semiconductor substrate, a surface of the second portion on a side opposite to the semiconductor substrate may be located between a surface of the active layer on a side opposite to the semiconductor substrate and a surface of the active layer on a side of the semiconductor substrate, and a part of the metal layer on the first portion may overlap the active layer when viewed in the width direction of the semiconductor substrate. In this case, the oscillation of the high-order mode can be effectively suppressed by locating the metal layer on the first portion beside the active layer while effectively improving heat dissipation by locating the second portion beside the active layer. As a result, both an improvement in heat dissipation and the suppression of the oscillation of the high-order mode can be realized in a well-balanced manner.

A thickness of the first portion may be thinner than a thickness of the second portion. In this case, both an improvement in heat dissipation and the suppression of the oscillation of the high-order mode can be realized in a more balanced manner.

The metal layer may be directly formed on the first portion. In this case, the metal layer can be disposed close to the active layer, and the oscillation of the high-order mode can be effectively suppressed by light absorption of the metal layer. In addition, for example, when another layer is formed between the metal layer and the first portion, a variation in a characteristic of suppressing the oscillation of the high-order mode occurs because of a manufacturing error of the another layer, but since the metal layer is directly formed on the first portion, such a situation can be suppressed, and the yield rate can be improved.

A quantum-cascade laser device according to one aspect of the present disclosure includes: the quantum-cascade laser element; and a drive unit that drives the quantum-cascade laser element. According to the quantum-cascade laser device, an improvement in heat dissipation, the suppression of the oscillation of the high-order mode, and an improvement in stability can be achieved.

Advantageous Effects of Invention

According to the present disclosure, it is possible to provide the quantum-cascade laser element and the quantum-cascade laser device capable of achieving an improvement in heat dissipation, the suppression of the oscillation of the high-order mode, and an improvement in stability.

DESCRIPTION OF EMBODIMENTS

Hereinafter, one embodiment of the present disclosure will be described in detail with reference to the drawings. In the following description, the same reference signs are used for the same or equivalent elements, and duplicated descriptions will be omitted.

[Configuration of Quantum-Cascade Laser Element]

Figure 1:
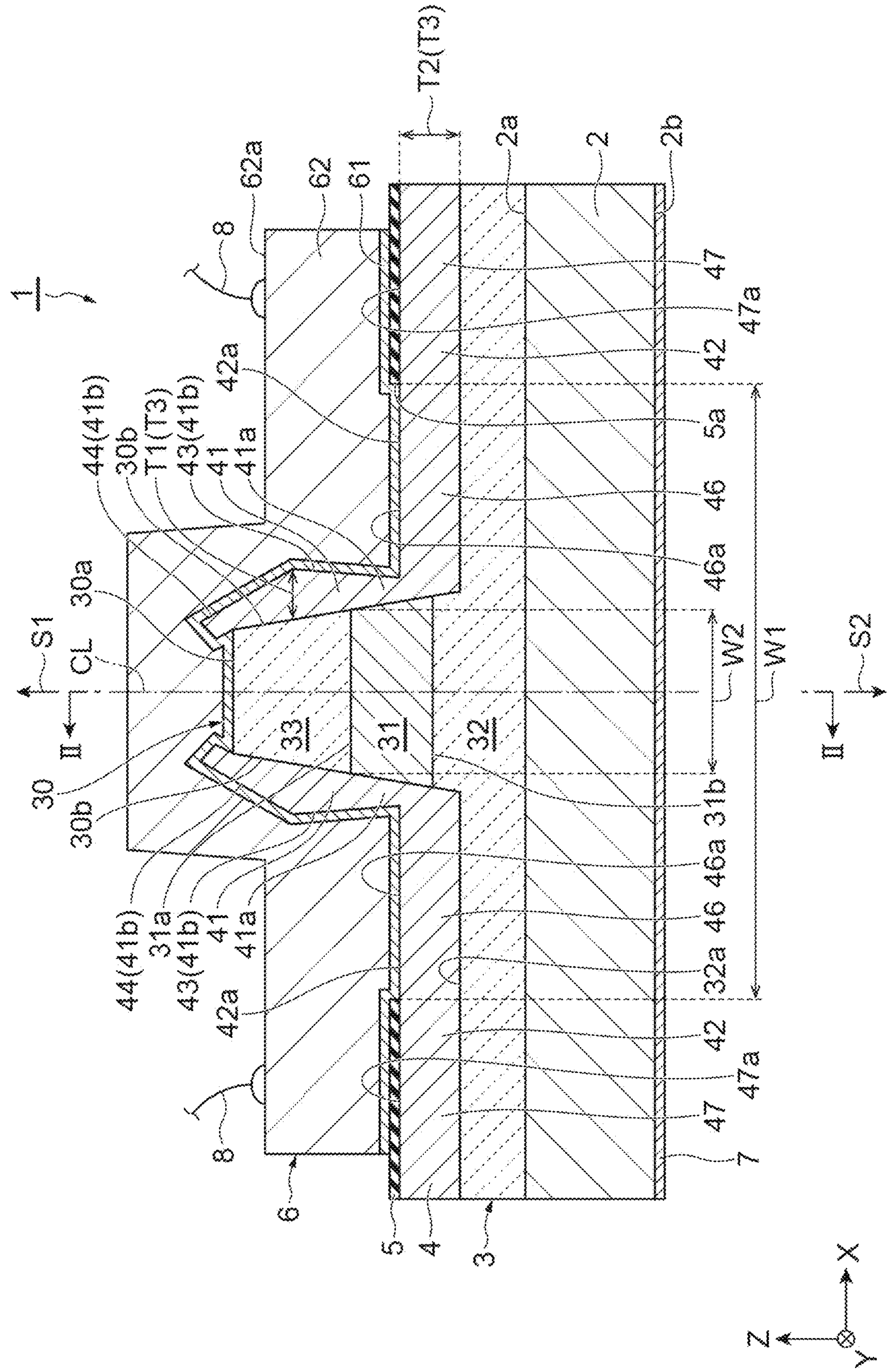
FIG. 1 is a cross-sectional view of a quantum-cascade laser element according to one embodiment.
Figure 2:
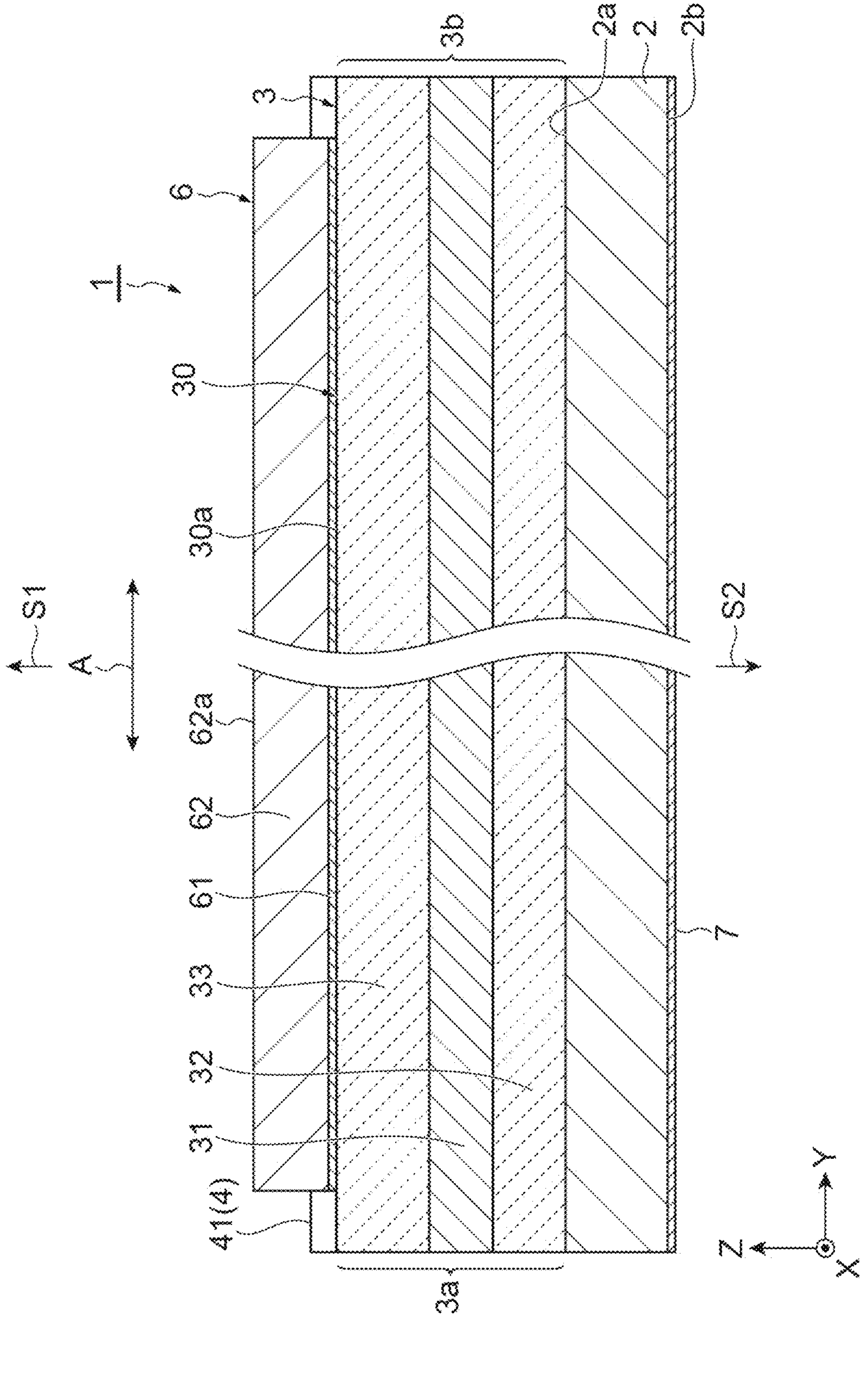
FIG. 2 is a cross-sectional view taken along line II-II of FIG. 1.

As shown in FIGS. 1 and 2, a quantum-cascade laser element 1 includes a semiconductor substrate 2, a semiconductor laminate 3, an embedding layer 4, a dielectric layer 5, a first electrode 6, and a second electrode 7. The semiconductor substrate 2 is, for example, an S-doped InP single crystal substrate having a rectangular plate shape. As one example, a length of the semiconductor substrate 2 is approximately 3 mm, a width of the semiconductor substrate 2 is approximately 500 μm, and a thickness of the semiconductor substrate 2 is approximately one hundred and several tens of μm. In the following description, a width direction of the semiconductor substrate 2 is referred to as an X-axis direction, a length direction of the semiconductor substrate 2 is referred to as a Y-axis direction, and a thickness direction of the semiconductor substrate 2 is referred to as a Z-axis direction. A side on which the semiconductor laminate 3 is located with respect to the semiconductor substrate 2 in the Z-axis direction is referred to as a first side S1, and a side on which the semiconductor substrate 2 is located with respect to the semiconductor laminate 3 in the Z-axis direction is referred to as a second side S2.

The semiconductor laminate 3 is formed on a surface 2*a* on the first side S1 of the semiconductor substrate 2. The semiconductor laminate 3 includes an active layer 31 having a quantum-cascade structure. The semiconductor laminate 3 is configured to oscillate laser light having a predetermined center wavelength (for example, a wavelength in a mid-infrared region which has a center wavelength of any value of 4 to 11 μm). In the present embodiment, the semiconductor laminate 3 is formed by stacking a lower cladding layer 32, a lower guide layer (not shown), the active layer 31, an upper guide layer (not shown), an upper cladding layer 33, and a contact layer (not shown) in order from a semiconductor substrate 2 side. The upper guide layer has a diffraction grating structure functioning as a distributed feedback (DFB) structure.

The active layer 31 has, for example, a multiple quantum well structure of InGaAs/InAlAs. Each of the lower cladding layer 32 and the upper cladding layer 33 is, for example, a Si-doped InP layer. Each of the lower guide layer and the upper guide layer is, for example, a Si-doped InGaAs layer. The contact layer is, for example, a Si-doped InGaAs layer.

The semiconductor laminate 3 includes a ridge portion 30 extending along the Y-axis direction. The ridge portion 30 is formed of a portion on the first side S1 of the lower cladding layer 32, the lower guide layer, the active layer 31, the upper guide layer, the upper cladding layer 33, and the contact layer. A width of the ridge portion 30 in the X-axis direction is narrower than a width of the semiconductor substrate 2 in the X-axis direction. A length of the ridge portion 30 in the Y-axis direction is equal to a length of the semiconductor substrate 2 in the Y-axis direction. As on example, the length of the ridge portion 30 is approximately 3 mm, the width of the ridge portion 30 is approximately 8 μm, and a thickness of the ridge portion 30 is approximately 8 μm. The ridge portion 30 is located at the center of the semiconductor substrate 2 in the X-axis direction. Each layer forming the semiconductor laminate 3 does not exist on both sides of the ridge portion 30 in the X-axis direction.

The ridge portion 30 has a top surface 30*a* and a pair of side surfaces 30*b*. The top surface 30*a* is a surface on the first side S1 of the ridge portion 30. The pair of side surfaces 30*b* are surfaces on both sides of the ridge portion 30 in the X-axis direction. In this example, each of the top surface 30*a* and the side surfaces 30*b* is a flat surface. When viewed in the Y-axis direction, each of the side surfaces 30*b* is inclined with respect to a center line CL of the ridge portion 30 to approach the center line CL as going away from the semiconductor substrate 2 (toward the first side S1). The center line CL is a straight line passing through the center (geometric center) of the ridge portion 30 and being parallel to the Z-axis direction when viewed in the Y-axis direction. The quantum-cascade laser element 1 is configured to be in line symmetry with respect to the center line CL when viewed in the Y-axis direction.

The semiconductor laminate 3 has a first end surface 3*a* and a second end surface 3*b* that are both end surfaces of the ridge portion 30 in a light waveguide direction A. The light waveguide direction A is a direction parallel to the Y-axis direction that is an extending direction of the ridge portion 30. The first end surface 3*a* and the second end surface 3*b* function as light-emitting end surfaces. The first end surface 3*a* and the second end surface 3*b* are located on the same planes as both respective end surfaces of the semiconductor substrate 2 in the Y-axis direction.

The embedding layer 4 is a semiconductor layer formed of, for example, a Fe-doped InP layer. The embedding layer 4 includes a pair of first portions 41 and a pair of second portions 42. The pair of first portions 41 are formed on the pair of respective side surfaces 30*b* of the ridge portion 30. The pair of second portions 42 extend from edge portions 41*a* on the second side S2 of the pair of respective first portions 41 in the X-axis direction. Each of the second portions 42 is formed on a surface 32*a* of the lower cladding layer 32. The surface 32*a* is a surface on the first side S1 of a portion of the lower cladding layer 32, the portion not forming the ridge portion 30.

A surface 42*a* on the first side S1 of each of the second portions 42 is located between a surface 31*a* on the first side S1 of and a surface 31*b* on the second side S2 of the active layer 31 in the Z-axis direction. In other words, when viewed in the X-axis direction, a part on the first side S1 of the second portions 42 overlaps a part on the second side S2 of the active layer 31.

Each of the first portions 41 is formed over the entirety of the corresponding side surface 30*b* of the ridge portion 30 and protrudes from the top surface 30*a* of the ridge portion 30 to the first side S1 in the Z-axis direction. A surface 41*b* of each of the first portions 41 on a side opposite to the ridge portion 30 has a first inclined surface 43 and a second inclined surface 44. In this example, each of the first inclined surface 43 and the second inclined surface 44 is a flat surface.

When viewed in the light waveguide direction A, the first inclined surface 43 is inclined with respect to the side surface 30*b* of the ridge portion 30 to go away from the side surface 30*b* of the ridge portion 30 as going away from the semiconductor substrate 2. In this example, when viewed in the light waveguide direction A, the first inclined surface 43 is also inclined with respect to the center line CL of the ridge portion 30 to go away from the center line CL as going away from the semiconductor substrate 2. The first inclined surface 43 is continuous with the surface 42*a* on the first side S1 of the second portions 42. When viewed in the X-axis direction, an edge portion of the first inclined surface 43 on a side of the semiconductor substrate 2 overlaps the active layer 31.

The second inclined surface 44 is located on the first side S1 with respect to the first inclined surface 43 and is continuous with the first inclined surface 43. When viewed in the light waveguide direction A, the second inclined surface 44 is inclined with respect to the center line CL of the ridge portion 30 to approach the center line CL as going away from the semiconductor substrate 2. In this example, when viewed in the light waveguide direction A, the second inclined surface 44 is also inclined with respect to the side surface 30*b* of the ridge portion 30 to approach the side surface 30*b* as going away from the semiconductor substrate 2. The second inclined surface 44 protrudes from the top surface 30*a* of the ridge portion 30 to the first side S1 in the Z-axis direction.

A thickness T1 of the first portions 41 is thinner than a thickness T2 of the second portions 42. The thickness T1 of the first portions 41 may be less than or equal to half the thickness T2 of the second portions 42. The thickness T1 of the first portions 41 is a maximum thickness of the first portions 41 in the X-axis direction. In this example, the thickness of the first portions 41 increases from the second side S2 toward a boundary between the first inclined surface 43 and the second inclined surface 44 and decreases from the boundary toward the first side S1. Namely, the thickness of the first portions 41 is at its maximum at the position of the boundary. Therefore, the thickness T1 of the first portions 41 is a distance between the side surface 30*b* of the ridge portion 30 and the boundary. The thickness T2 of the second portions 42 is a maximum thickness of the second portions 42 in the Z-axis direction. In this example, the thickness of the second portions 42 is uniform throughout the second portions 42. As one example, the thickness T1 of the first portions 41 is approximately 1 to 2 μm, and the thickness T2 of the second portions 42 is approximately 3.0 μm.

The dielectric layer 5 is, for example, an insulating layer formed of a SiN film or a $SiO_2$ film. The dielectric layer 5 is formed on a surface 47*a* of an outer portion 47 of the second portion 42 such that the top surface 30*a* of the ridge portion 30, the surface 41*b* of each of the first portions 41, and a surface 46*a* of an inner portion 46 of each of the second portions 42 are exposed from the dielectric layer 5. The inner portion 46 is a portion of the second portion 42, which is continuous with the first portion 41, and the outer portion 47 is a portion of the second portion 42, which is located outside the inner portion 46 in the X-axis direction. The surface 46*a* is a surface on the first side S1 of the inner portion 46, and the surface 47*a* is a surface on the first side S1 of the outer portion 47.

The dielectric layer 5 is formed on the surface 47*a* of the outer portion 47 and is not formed on the surface 46*a* of the inner portion 46 to expose the surface 46*a*. In other words, an opening 5*a* that exposes the inner portion 46 from the dielectric layer 5 is formed in the dielectric layer 5. The opening 5*a* exposes the top surface 30*a* of the ridge portion 30, the surface 41*b* of each of the first portions 41, and the surface 46*a* of the inner portion 46 of each of the second portions 42 from the dielectric layer 5. An outer edge of the dielectric layer 5 reaches an outer edge of the embedding layer 4 in both the X-axis direction and the Y-axis direction. The dielectric layer 5 also functions as an adhesion layer that enhances adhesion between the embedding layer 4 and a metal layer 61 to be described later.

A width W1 of the opening 5*a* in the X-axis direction is more than or equal to two times a width W2 of the active layer 31 in the X-axis direction. The width W1 may be more than or equal to five times the width W2. As one example, the width W1 is approximately 50 μm and the width W2 is approximately 9 μm. When the width of the active layer 31 narrows toward the first side S1 as in the present embodiment, the width W2 of the active layer 31 is a width of an end portion on the first side S1.

The width W1 of the opening 5*a* in the X-axis direction may be more than or equal to ten times a thickness T3 of the embedding layer 4 in the Z-axis direction. The thickness T3 of the embedding layer 4 is the thicker of the thickness T1 of the first portions 41 and the thickness T2 of the second portions 42 and is the thickness T2 in this example. Namely, the width W1 of the opening 5*a* may be more than or equal to ten times the thickness T2 of the second portions 42. As described above, the thickness T2 of the second portions 42 is, for example, approximately 3 μm.

The first electrode 6 includes the metal layer 61 and a plating layer 62. The metal layer 61 is, for example, a Ti/Au layer and functions as a foundation layer for forming the plating layer 62. The plating layer 62 is formed on the metal layer 61. The plating layer 62 is, for example, an Au plating layer. A thickness of the first electrode 6 in the Z-axis direction is, for example, 6 μm or more.

The metal layer 61 is integrally formed to extend over the top surface 30*a* of the ridge portion 30 and over the first portions 41 and the second portions 42 of the embedding layer 4. The metal layer 61 is in contact with the top surface 30*a* of the ridge portion 30. Accordingly, the first electrode 6 is electrically connected to the upper cladding layer 33 via the contact layer. An outer edge of the metal layer 61 is located inside the outer edges of the embedding layer 4 and the dielectric layer 5 in both the X-axis direction and the Y-axis direction. A distance between the outer edge of the metal layer 61 and the outer edge of the dielectric layer 5 (outer edges of the semiconductor substrate 2, the semiconductor laminate 3, and the embedding layer 4) in the X-axis direction is, for example, approximately 50 μm.

The metal layer 61 is directly formed on the first portions 41. Namely, another layer (for example, the dielectric layer or the insulating layer) is not formed between the metal layer 61 and the first portions 41. The metal layer 61 is formed over the entirety of the surface 41*b* of each of the first portions 41 and extends over the first inclined surface 43 and over the second inclined surface 44. When viewed in the X-axis direction, a part of the metal layer 61 on the first inclined surfaces 43 overlaps the active layer 31. More specifically, an edge portion on the second side S2 of the metal layer 61 on the first inclined surfaces 43 overlaps the active layer 31. The metal layer 61 is provided to cover a portion of the first portions 41, the portion protruding from the top surface 30*a* of the ridge portion 30.

The metal layer 61 is in contact with the surface 46*a* of each of the inner portions 46 at the inner portion 46 of each of the second portions 42 through the opening 5*a* formed in the dielectric layer 5. The metal layer 61 is formed on the second portions 42 at the outer portion 47 of each of the second portions 42 with the dielectric layer 5 interposed therebetween. Namely, the dielectric layer 5 is disposed between the outer portion 47 of each of the second portions 42 and the first electrode 6. When viewed in the Z-axis direction, an outer edge of the first electrode 6 is located inside the outer edges of the semiconductor substrate 2, the semiconductor laminate 3, the embedding layer 4, and the dielectric layer 5.

A plurality of wires 8 are electrically connected to a surface 62*a* on the first side S1 of the plating layer 62. Each of the wires 8 is formed, for example, by wire bonding and is electrically connected to the metal layer 61 via the plating layer 62. A connection position between the metal layer 61 (plating layer 62) and each of the wires 8 overlaps the dielectric layer 5 when viewed in the Z-axis direction. The number of the wires 8 is not limited and only one wire 8 may be provided.

The second electrode 7 is formed on the surface 2*b* on the second side S2 of the semiconductor substrate 2. The second electrode 7 is, for example, an AuGe/Au film, an AuGe/Ni/Au film, or an Au film. The second electrode 7 is electrically connected to the lower cladding layer 32 via the semiconductor substrate 2.

In the quantum-cascade laser element 1, when a bias voltage is applied to the active layer 31 via the first electrode 6 and through the second electrode 7, light is emitted from the active layer 31, and light having a predetermined center wavelength of the light is resonated in the distributed feedback structure. Accordingly, the laser light having the predetermined center wavelength is emitted from each of the first end surface 3*a* and the second end surface 3*b*. Ahigh reflection film may be formed on one end surface of the first end surface 3*a* and the second end surface 3*b*. In this case, the laser light having the predetermined center wavelength is emitted from the other end surface of the first end surface 3*a* and the second end surface 3*b*. Alternatively, a low reflection film may be formed on one end surface of the first end surface 3*a* and the second end surface 3*b*. In addition, a high reflection film may be formed on the other end surface different from the end surface on which the low reflection film is formed. In both cases, the laser light having the predetermined center wavelength is emitted from one end surface of the first end surface 3*a* and the second end surface 3*b*. In the former case, the laser light is emitted from both the first end surface 3*a* and the second end surface 3*b*.

The quantum-cascade laser element 1 can form a quantum-cascade laser device, together with a drive unit that drives the quantum-cascade laser element 1. The drive unit is electrically connected to the first electrode 6 and to the second electrode 7. The drive unit is, for example, a pulse drive unit that drives the quantum-cascade laser element 1 such that the quantum-cascade laser element 1 oscillates the laser light in a pulsed manner.

[Method for Manufacturing Quantum-Cascade Laser Element]

Figure 3:
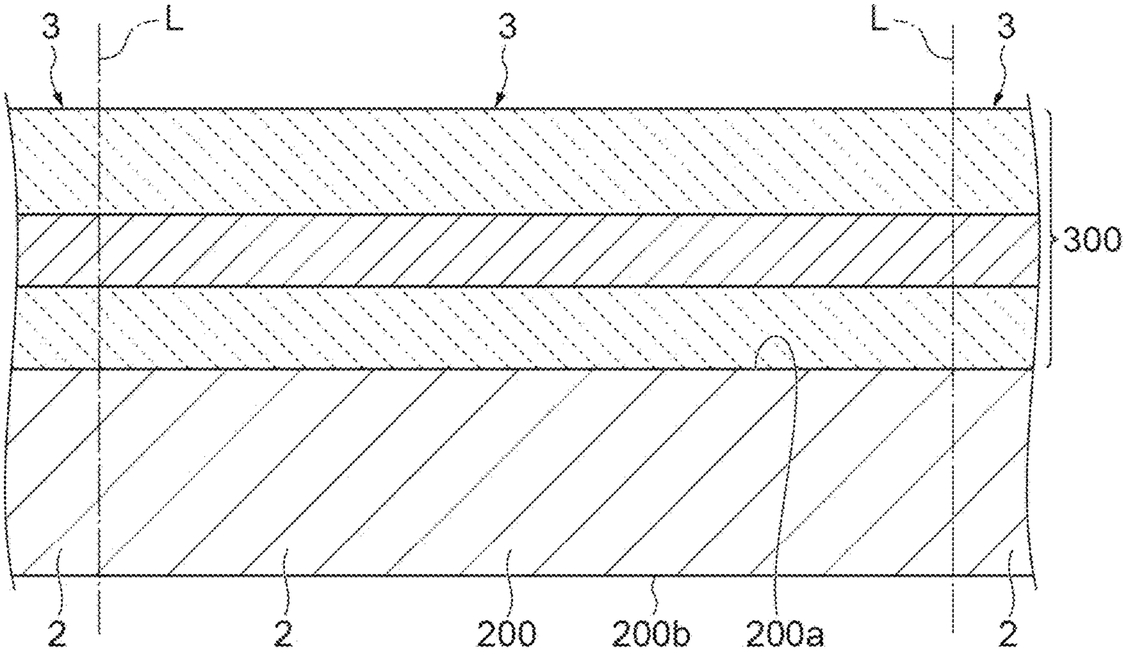
FIGS. 3(*a*) and 3(*b*) are views showing a method for manufacturing a quantum-cascade laser element.
Figure 3:
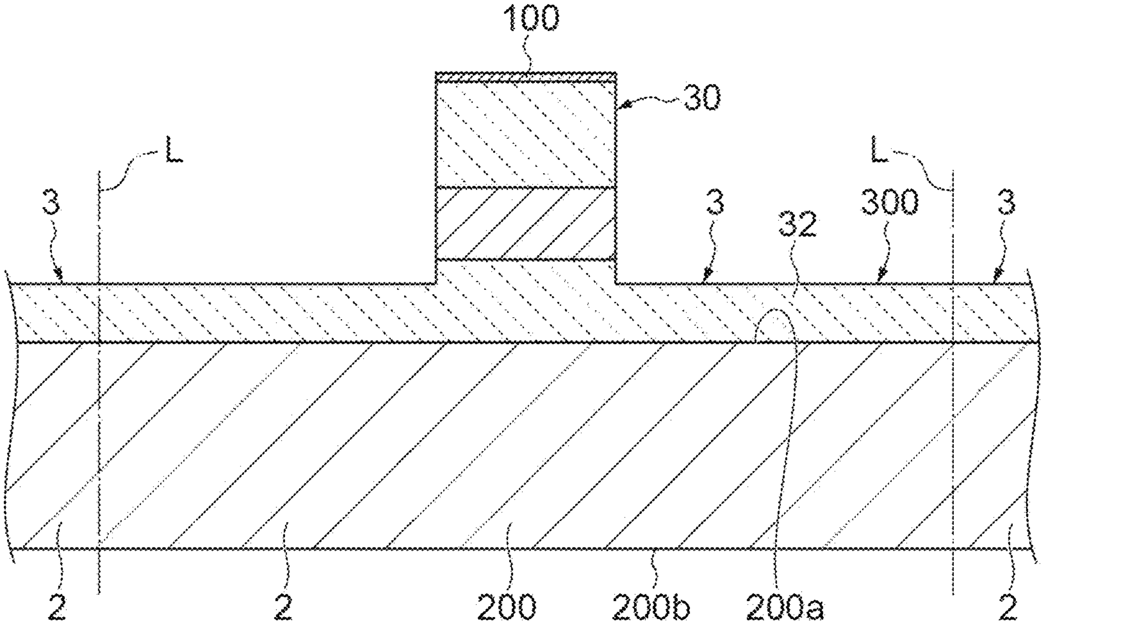

A method for manufacturing the quantum-cascade laser element 1 will be described with reference to FIGS. 3 to 6. First, as shown in FIG. 3(*a*), a semiconductor wafer 200 having a first major surface 200*a* and a second major surface 200*b* is prepared, and a semiconductor layer 300 is formed on the first major surface 200*a* of the semiconductor wafer 200. The semiconductor wafer 200 is, for example, an S-doped InP single crystal (100) wafer. The semiconductor wafer 200 includes a plurality of portions, each of which becomes the semiconductor substrate 2, and is cleaved along a line L in a post-process to be described later. Similarly, the semiconductor layer 300 also includes a plurality of portions, each of which becomes the semiconductor laminate 3. The semiconductor layer 300 is formed, for example, by epitaxially growing each layer (namely, a layer becoming each of the lower cladding layer 32, the lower guide layer, the active layer 31, the upper guide layer, the upper cladding layer 33, and the contact layer) using MO-CVD.

Subsequently, as shown in FIG. 3(*b*), a dielectric film 100 is formed on a portion of the semiconductor layer 300, the portion becoming the ridge portion 30, and the semiconductor layer 300 is dry-etched up to the lower cladding layer 32 using the dielectric film 100 as a mask. The dielectric film 100 is formed of, for example, a SiN film or a $SiO_2$ film. The dielectric film 100 is patterned into a shape shown in FIG. 3(*b*) by, for example, photolithography and etching. A width of the dielectric film 100 in the X-axis direction is, for example, approximately 10 μm.

Figure 4:
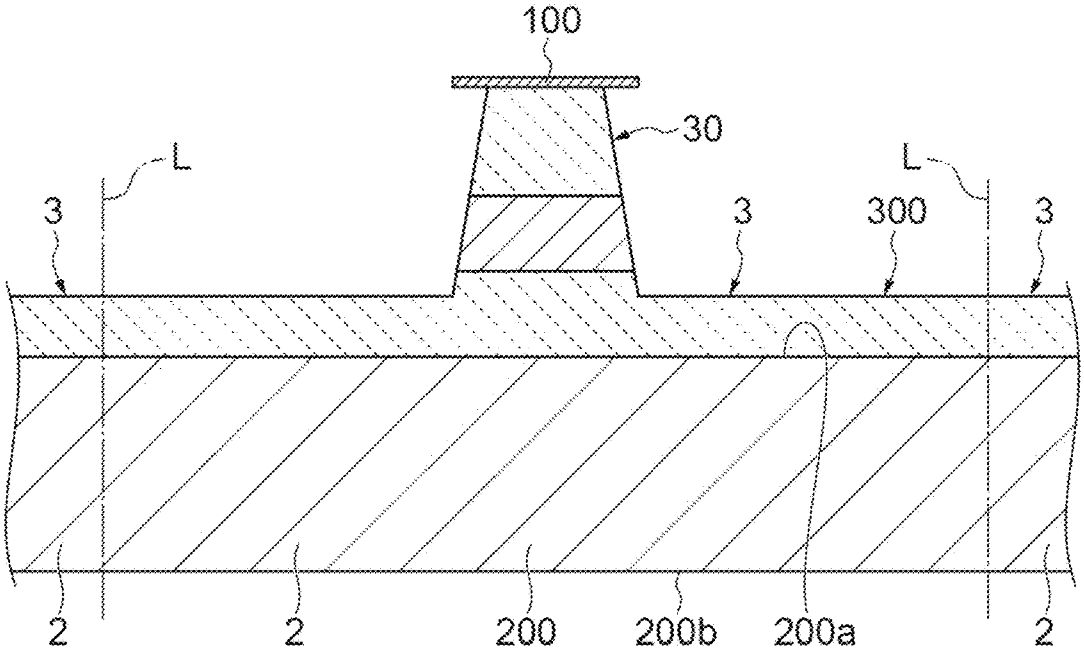
FIGS. 4(*a*) and 4(*b*) are views showing the method for manufacturing a quantum-cascade laser element.
Figure 4:
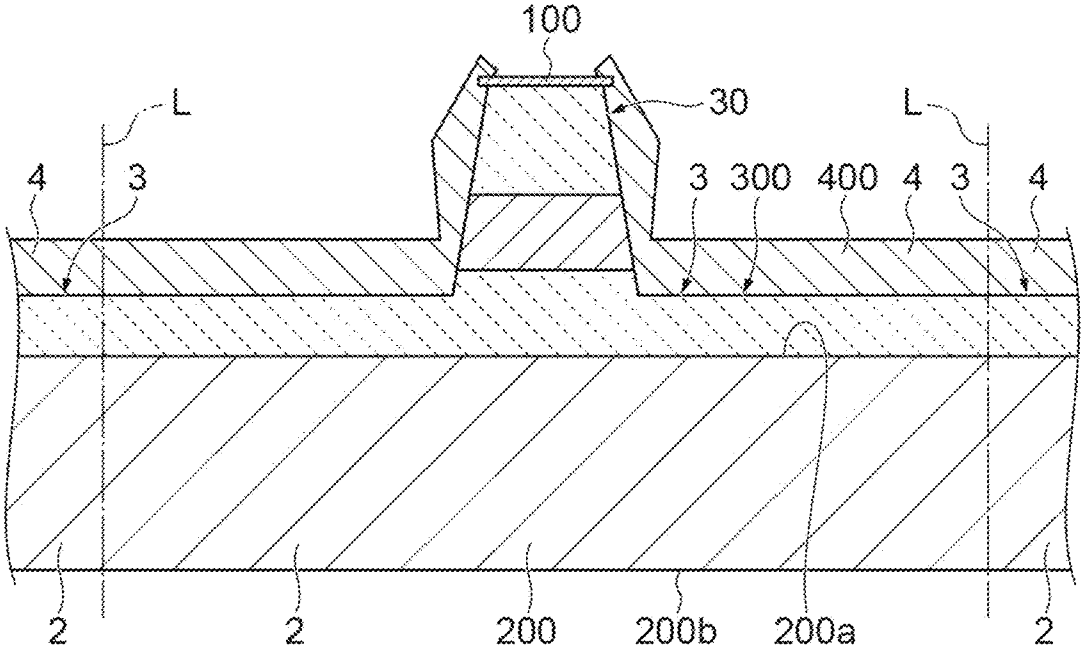

Subsequently, as shown in FIG. 4(*a*), the semiconductor layer 300 is wet-etched using the dielectric film 100 as a mask. Accordingly, the ridge portion 30 is formed on the semiconductor layer 300.

Subsequently, as shown in FIG. 4(*b*), an embedding layer 400 is formed on the semiconductor layer 300. The embedding layer 400 includes a plurality of portions, each of which becomes the embedding layer 4. The embedding layer 400 is formed, for example, by crystal growth using MO-CVD. Since the dielectric film 100 functions as a mask, the embedding layer 400 is not formed on the dielectric film 100.

Figure 5:
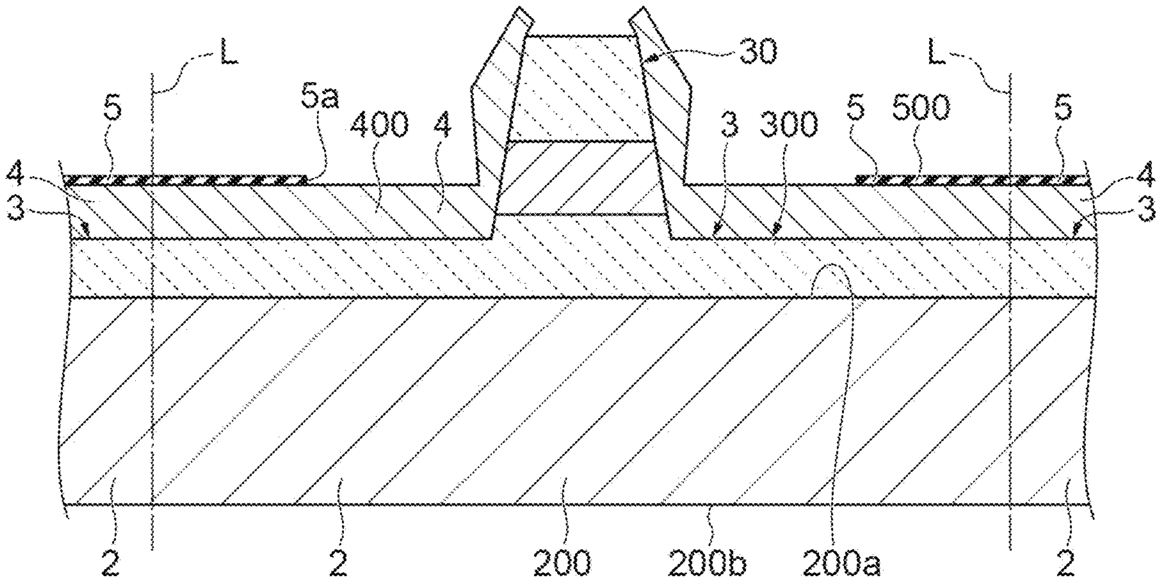
FIGS. 5(*a*) and 5(*b*) are views showing the method for manufacturing a quantum-cascade laser element.
Figure 5:
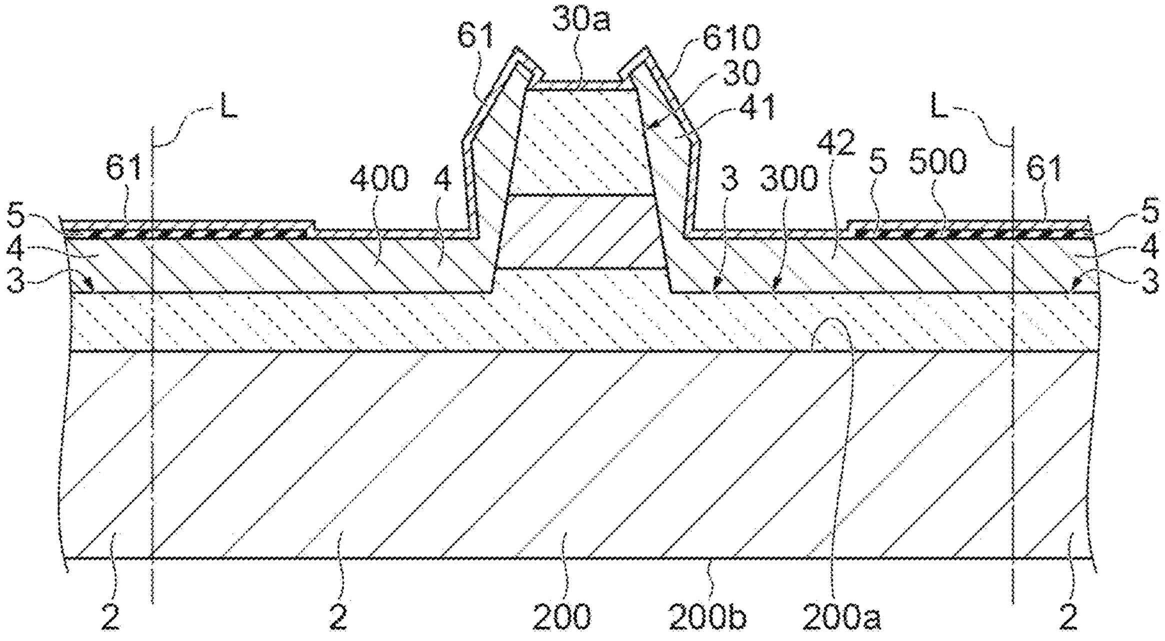

Subsequently, as shown in FIG. 5(*a*), the dielectric film 100 is removed by etching, and a dielectric layer 500 is formed on the embedding layer 400. The dielectric layer 500 includes a plurality of portions, each of which becomes the dielectric layer 5. The dielectric layer 500 is patterned into a shape shown in FIG. 5(*a*) by, for example, photolithography and etching. Accordingly, the opening 5*a* (contact hole) is formed in the dielectric layer 500.

Figure 6:
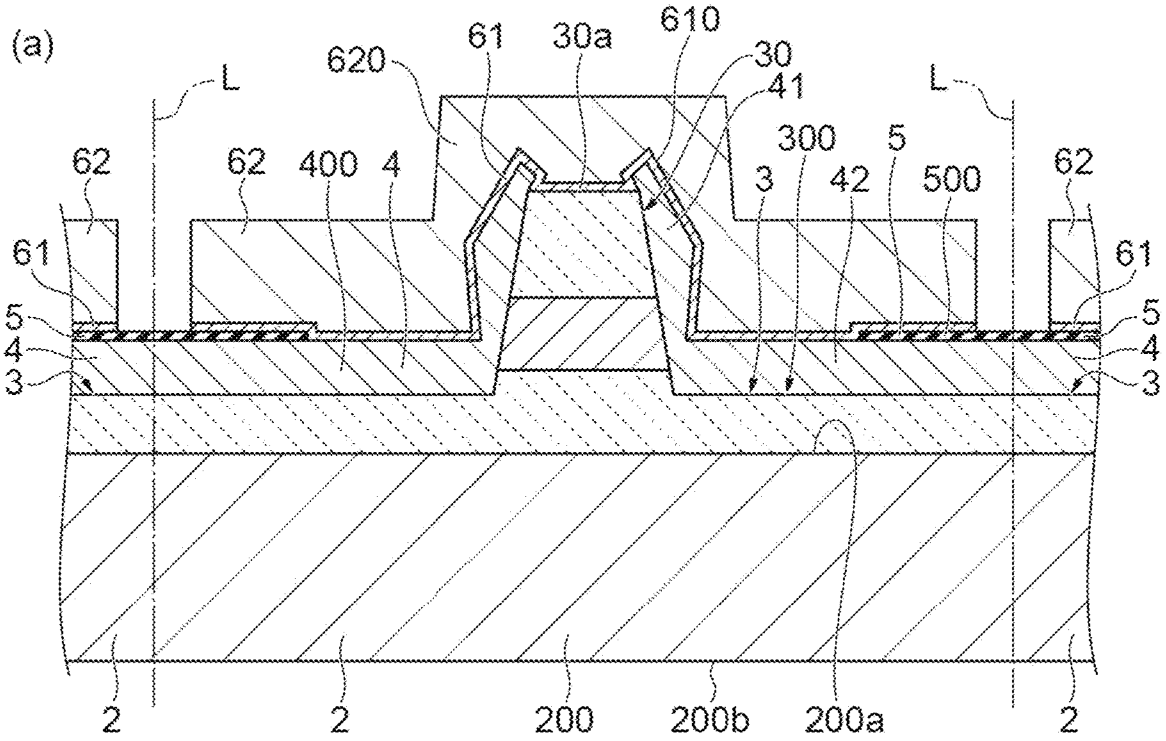
FIGS. 6(*a*) and 6(*b*) are views showing the method for manufacturing a quantum-cascade laser element.
Figure 6:
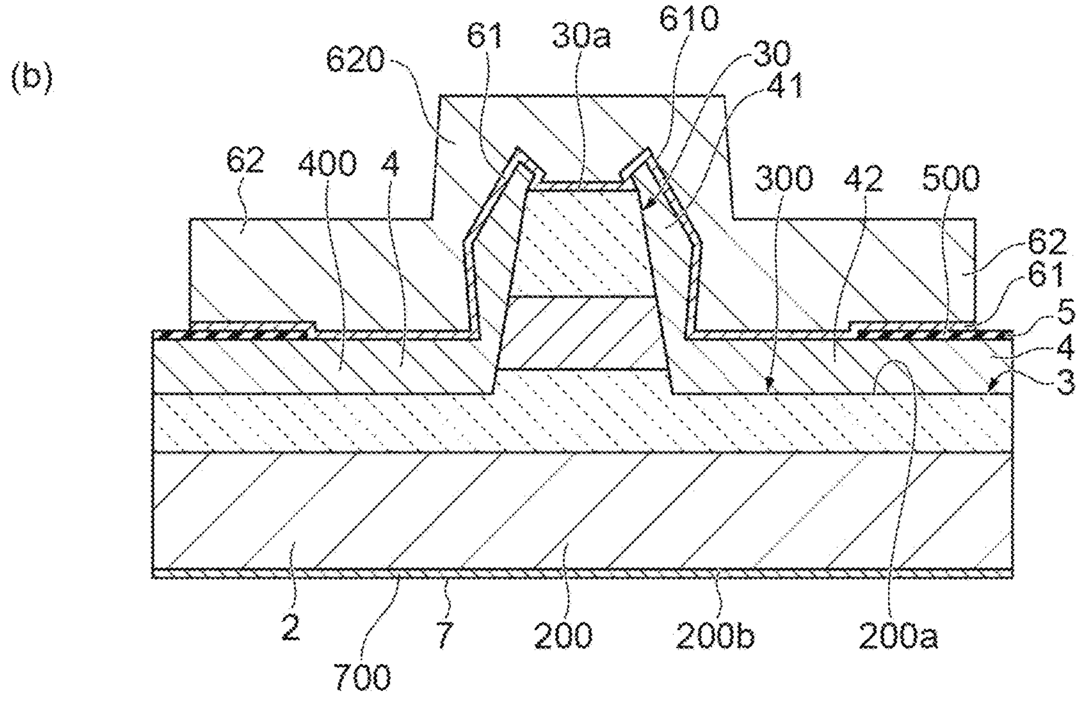

Subsequently, as shown in FIG. 5(*b*), a metal layer 610 is formed over the top surface 30*a* of the ridge portion 30 and over the first portions 41 and the second portions 42 of the embedding layer 4. Subsequently, as shown in FIG. 6(*a*), a plating layer 620 is formed on the metal layer 610 by plating. The metal layer 610 includes a plurality of portions, each of which becomes the metal layer 61, and the plating layer 620 includes a plurality of portions, each of which becomes the plating layer 62. The metal layer 610 is formed, for example, by sputtering or evaporating Ti having a thickness of approximately 50 nm and Au having a thickness of approximately 300 nm in this order. The metal layer 610 on the line L is removed, for example, by etching after the plating layer 620 is formed. The line L is a planned cleavage line that partitions between a plurality of portions that become the quantum-cascade laser elements 1.

Subsequently, as shown in FIG. 6(*b*), the semiconductor wafer 200 is thinned by polishing the second major surface 200*b* of the semiconductor wafer 200. Subsequently, an electrode layer 700 is formed on the second major surface 200*b* of the semiconductor wafer 200. The electrode layer 700 includes a plurality of portions, each of which becomes the second electrode 7. The electrode layer 700 may be subjected to an alloy heat treatment. Subsequently, the semiconductor wafer 200 and the semiconductor layer 300 are cleaved along the line L. Accordingly, a plurality of the quantum-cascade laser elements 1 are obtained.

Functions and Effects

The quantum-cascade laser element 1 is provided with the embedding layer 4 including the first portions 41 formed on the side surfaces 30*b* of the ridge portion 30, and the second portions 42 extending from the edge portions 41*a* on the second side S2 of the first portions 41 along the X-axis direction (width direction of the semiconductor substrate 2). Accordingly, heat generated in the active layer 31 can be effectively dissipated. In addition, the metal layer 61 is formed on the first portions 41 formed on the side surfaces 30*b* of the ridge portion 30. Accordingly, the oscillation of a high-order mode can be suppressed while suppressing a loss in a basic mode. In addition, the dielectric layer 5 is disposed between the second portions 42 and the metal layer 61. Accordingly, bond strength between the metal layer 61 and the embedding layer 4 can be improved. As a result, the peeling or degradation of the metal layer 61 can be suppressed, and the stability of the laser element can be improved. In addition, a part of the second portions 42 is exposed from the dielectric layer 5, and the metal layer 61 is contact with the second portions 42 at the part. Accordingly, heat dissipation can be further improved. Therefore, according to the quantum-cascade laser element 1, an improvement in heat dissipation, the suppression of the oscillation of the high-order mode, and an improvement in stability can be achieved. Generally, a thermal conductivity of a SiN or $SiO_2$ dielectric is lower than a thermal conductivity of a semiconductor or metal.

Figure 7:
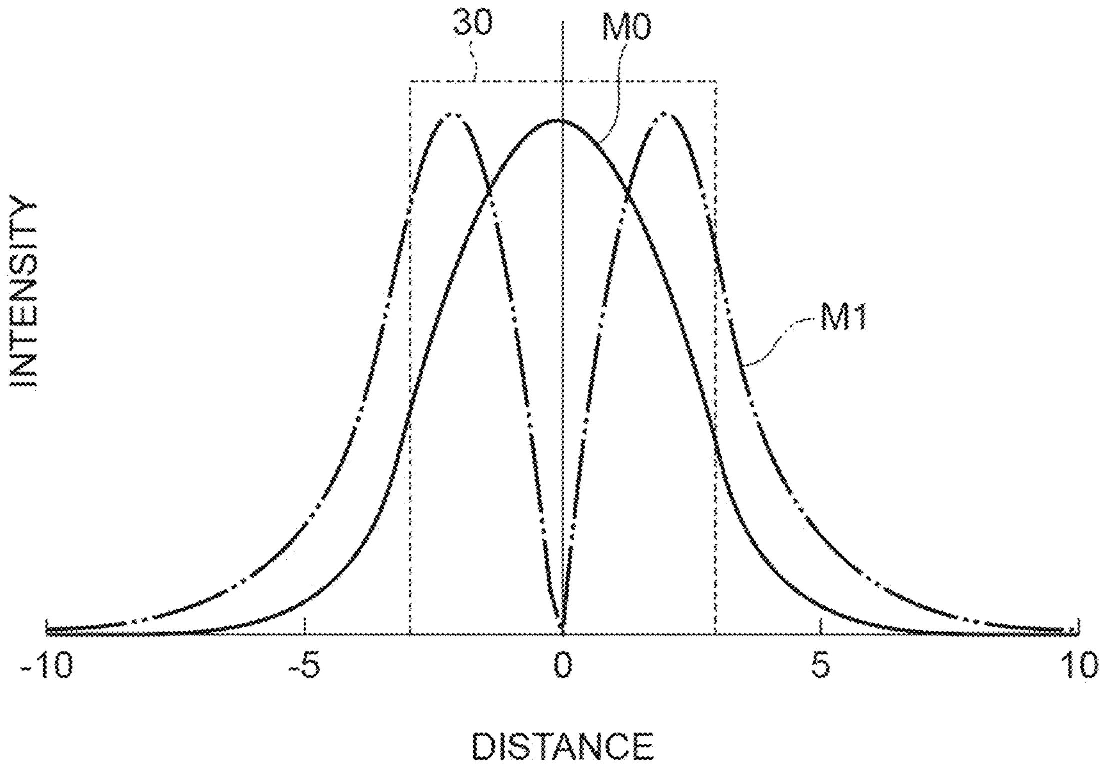
FIG. 7 is a graph showing an example of an electric field intensity distribution in the quantum-cascade laser element.

Here, an effect of suppressing the oscillation of a high-order transverse mode will be further described with reference to FIGS. 7 and 8. FIG. 7 shows an electric field intensity distribution in the width direction of the semiconductor substrate 2 with the center of the ridge portion 30 set as an origin of an X axis. An intensity distribution of a basic mode M0 is shown by a solid line, and an intensity distribution of a primary mode M1 is shown by an alternate long and two short dashed line. As shown in FIG. 7, light of the basic mode M0 has a peak of intensity in the vicinity of the center of the ridge portion 30, and light of the primary mode M1 has a peak of intensity on both sides of the center of the ridge portion 30.

Figure 8:
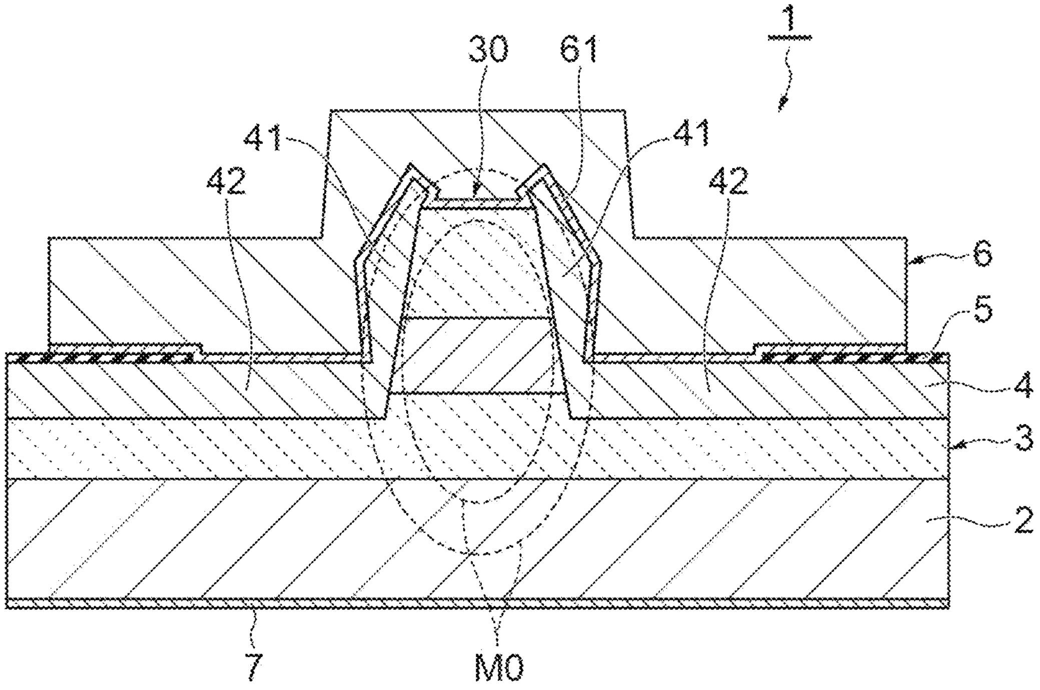
FIG. 8(*a*) is a view showing an example of an extension of a basic mode, and FIG. 8(*b*) is a view showing an example of an extension of a primary mode.
Figure 8:
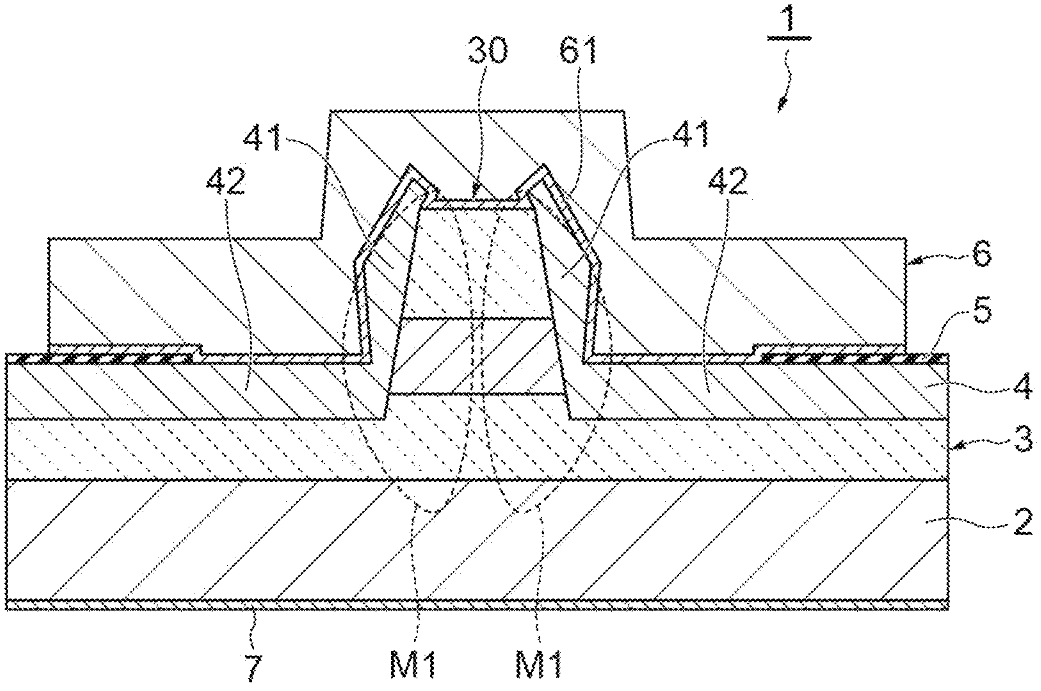

FIG. 8(*a*) is a view showing an extension of the basic mode M0 when viewed in the light waveguide direction A, and FIG. 8(*b*) is a view showing an extension of the primary mode M1 when viewed in the light waveguide direction A. As shown in FIGS. 8(*a*) and 8(*b*), each of the basic mode M0 and the primary mode M1 has a substantially elliptical extension of which a major axis is along the Z-axis direction. As described above, since the metal layer 61 that tends to absorb light is formed on the first portions 41, the oscillation of the light of the primary mode M1 can be suppressed while suppressing loss of the light of the basic mode M0 (while confining the light of the basic mode M0 in the ridge portion 30).

The opening 5*a* that exposes the inner portions 46 of the second portions 42 from the dielectric layer 5 is formed in the dielectric layer 5, the inner portions 46 being continuous with the first portions 41, and the metal layer 61 is in contact with the inner portions 46 through the opening 5*a*. Accordingly, since the metal layer 61 is in contact with the second portions 42 in inner regions close to the ridge portion 30, heat dissipation can be even further improved. On the other hand, the metal layer 61 is firmly bonded to the second portions 42 in outer regions far from the ridge portion 30, with the dielectric layer 5 interposed therebetween. Since the metal layer 61 is firmly bonded to the second portions 42 in outer regions in which the peeling or the like of the metal layer 61 is likely to occur, the peeling or the like of the metal layer 61 can be effectively suppressed. In addition, there is a possibility that a cleavage streak is formed in the vicinity of an inner edge of the dielectric layer 5 (inner edge of the opening 5*a*) because of a cleavage process during manufacturing, but since the inner edge of the opening 5*a* is separated from the ridge portion 30, the influence of the cleavage streak on a light output characteristic can be suppressed. For example, the cleavage streak can be formed in the embedding layer 4 and reach the lower cladding layer 32 and the semiconductor substrate 2.

The width W1 of the opening 5*a* in the X-axis direction is more than or equal to two times the width of the active layer 31. Accordingly, a region in which the metal layer 61 is in contact with the second portions 42 can be widened, and heat dissipation can be even further improved. In addition, the influence of the cleavage streak on the light output characteristic can be further suppressed.

The width W1 of the opening 5*a* in the X-axis direction is more than or equal to ten times the thickness T3 of the second portions 42. Accordingly, the region in which the metal layer 61 is in contact with the second portions 42 can be further widened, and heat dissipation can be even further improved. In addition, the influence of the cleavage streak on the light output characteristic can be further suppressed.

The wires 8 made of metal are electrically connected to the metal layer 61, and the connection position between the metal layer 61 and each of the wires 8 overlaps the dielectric layer 5 when viewed in the Z-axis direction (thickness direction of the semiconductor substrate 2). Accordingly, the occurrence of the peeling or the like of the metal layer 61 caused by a tensile stress that the wires 8 act on the metal layer 61 can be suppressed.

The surface 42*a* on the first side S1 (side opposite to the semiconductor substrate 2) of each of the second portions 42 is located between the surface 31*a* on the first side S1 of and the surface 31*b* on the second side S2 (semiconductor substrate 2 side) of the active layer 31 in the Z-axis direction (thickness direction of the semiconductor substrate 2), and when viewed in the X-axis direction, a part of the metal layer 61 on the first portions 41 overlaps the active layer 31. Accordingly, the oscillation of the high-order mode can be effectively suppressed by locating the metal layer 61 on the first portions 41 beside the active layer 31 while effectively improving heat dissipation by locating the second portions 42 beside the active layer 31. As a result, both an improvement in heat dissipation and the suppression of the oscillation of the high-order mode can be realized in a well-balanced manner.

The thickness T1 of the first portions 41 is thinner than the thickness T2 of the second portions 42. Accordingly, both an improvement in heat dissipation and the suppression of the oscillation of the high-order mode can be realized in a more balanced manner.

The metal layer 61 is directly formed on the first portions 41. Accordingly, the metal layer 61 can be disposed close to the active layer 31, and the oscillation of the high-order mode can be effectively suppressed by light absorption of the metal layer 61. In addition, for example, when another layer (for example, the dielectric layer or the insulating layer) is formed between the metal layer 61 and the first portions 41, a variation in the characteristic of suppressing the oscillation of the high-order mode occurs because of a manufacturing error of the another layer, which is a concern. For example, because of an alignment error, the thickness of the another layer differs between one side and the other side of the ridge portion 30 in the X-axis direction, and a refractive index structure differs, which is a concern. In this regard, in the quantum-cascade laser element 1, since the metal layer 61 is directly formed on the first portions 41, such a situation can be suppressed, and the yield rate can be improved.

Modification Examples

The present disclosure is not limited to the above-described embodiment. The material and the shape of each configuration are not limited to the material and the shape described above, and various materials and shapes can be adopted. Another known quantum-cascade structure is applicable to the active layer 31. Another known stack structure is applicable to the semiconductor laminate 3. As one example, in the semiconductor laminate 3, the upper guide layer may not have a diffraction grating structure functioning as a distributed feedback structure.

The outer edge of the metal layer 61 in the Y-axis direction may reach the outer edges of the embedding layer 4 and the dielectric layer 5. In this case, heat dissipation on the first end surface 3*a* and on the second end surface 3*b* can be improved. Each of the side surfaces 30*b* of the ridge portion 30 may extend parallel to the center line CL. The metal layer 61 may be configured to include a plurality of portions separated from each other. For example, the metal layer 61 on the first portions 41 may be provided separately from the metal layer 61 on the second portions 42.

The plating layer 62 may not be provided, and only the metal layer 61 may form the first electrode 6. In this case, the wires 8 may be connected to a surface on the first side S1 of the metal layer 61. In the embodiment, the inner portions 46 of the second portions 42 are exposed from the dielectric layer 5, and the metal layer 61 is in contact with the inner portions 46, but a part of the second portions 42 may be exposed from the dielectric layer 5, and the metal layer 61 may be in contact with the second portions 42 at the part. In the embodiment, the surface 62*a* of the plating layer 62 is located on the second side S2 with respect to the top surface 30*a* of the ridge portion 30, but the surface 62*a* may be located on the first side S1 with respect to the top surface 30*a*. The plating layer 62 may be formed by plating such that the surface 62*a* is located on the first side S1 with respect to the top surface 30*a*, and then the surface 62*a* may be flattened by polishing.

REFERENCE SIGNS LIST

1: quantum-cascade laser element, 2: semiconductor substrate, 3: semiconductor laminate, 4: embedding layer, 5: dielectric layer, 5*a*: opening, 8: wire, 30: ridge portion, 30*a*: top surface, 30*b*: side surface, 31: active layer, 31*a*, 31*b*: surface, 41: first portion, 41*a*: edge portion, 42: second portion, 42*a*: surface, 46: inner portion, 61: metal layer.

The invention claimed is:

1. A quantum-cascade laser element comprising:

a semiconductor substrate;

a semiconductor laminate formed on the semiconductor substrate to include a ridge portion configured to include an active layer having a quantum-cascade structure;

an embedding layer including a first portion formed on a side surface of the ridge portion, and a second portion extending from an edge portion of the first portion on a side of the semiconductor substrate along a width direction of the semiconductor substrate;

a metal layer formed on a top surface of the ridge portion, on the first portion, and on the second portion; and a dielectric layer disposed between the second portion and the metal layer;

a wire made of metal, that is electrically connected to the metal layer, the wire is a bonding wire extending in a line shape, and wherein a connection position between the metal layer and the wire overlaps the dielectric layer when viewed in a thickness direction of the semiconductor substrate, wherein the dielectric layer is formed such that a part of the second portion is exposed from the dielectric layer, the metal layer is in direct contact with the second portion at the part.

2. The quantum-cascade laser element according to claim 1, wherein an opening that exposes an inner portion of the second portion from the dielectric layer is formed in the dielectric layer, the inner portion being continuous with the first portion, and the metal layer is in contact with the inner portion through the opening.

3. The quantum-cascade laser element according to claim 2, wherein a width of the opening in the width direction of the semiconductor substrate is more than or equal to two times a width of the active layer.

4. The quantum-cascade laser element according to claim 2, wherein a width of the opening in the width direction of the semiconductor substrate is more than or equal to ten times a thickness of the second portion.

5. The quantum-cascade laser element according to claim 1, further comprising:

a wire made of metal, that is electrically connected to the metal layer, and wherein a connection position between the metal layer and the wire overlaps the dielectric layer when viewed in a thickness direction of the semiconductor substrate.

6. The quantum-cascade laser element according to claim 1, wherein, in a thickness direction of the semiconductor substrate, a surface of the second portion on a side opposite to the semiconductor substrate is located between a surface of the active layer on a side opposite to the semiconductor substrate and a surface of the active layer on a side of the semiconductor substrate, and a part of the metal layer on the first portion overlaps the active layer when viewed in the width direction of the semiconductor substrate.

7. The quantum-cascade laser element according to claim 1, wherein a thickness of the first portion is thinner than a thickness of the second portion.

8. The quantum-cascade laser element according to claim 1, wherein the metal layer is directly formed on the first portion.

9. A quantum-cascade laser device comprising:

the quantum-cascade laser element according to claim 1; and a drive unit that drives the quantum-cascade laser element.

10. The quantum-cascade laser element according to claim 1, wherein the active layer and the second portion are non-overlapping in a thickness direction of the semiconductor substrate.

11. The quantum-cascade laser element according to claim 1, further comprising an electrode including the metal layer, wherein:

the electrode has a portion overlapping with the part of the second portion of the embedding layer in a thickness direction of the semiconductor substrate, the active layer has a surface on a side opposite to the semiconductor substrate in the thickness direction of the semiconductor substrate, and in the thickness direction of the semiconductor substrate, a surface of the portion of the electrode is on a side opposite to the semiconductor substrate with respect to the surface of the active layer.

12. A quantum-cascade laser element comprising:

a semiconductor substrate;

a semiconductor laminate formed on the semiconductor substrate to include a ridge portion configured to include an active layer having a quantum-cascade structure;

an embedding layer including a first portion formed on a side surface of the ridge portion, and a second portion extending from an edge portion of the first portion on a side of the semiconductor substrate along a width direction of the semiconductor substrate;

a metal layer formed on a top surface of the ridge portion, on the first portion, and on the second portion; and a dielectric layer disposed between the second portion and the metal layer, wherein the dielectric layer is formed such that a part of the second portion is exposed from the dielectric layer, and the metal layer is in direct contact with the second portion at the part, wherein, in a thickness direction of the semiconductor substrate, a surface of the second portion on a side opposite to the semiconductor substrate is located between a surface of the active layer on a side opposite to the semiconductor substrate and a surface of the active layer on a side of the semiconductor substrate, and a part of the metal layer on the first portion overlaps the active layer when viewed in the width direction of the semiconductor substrate.

13. A quantum-cascade laser element comprising:

a semiconductor substrate;

a semiconductor laminate formed on the semiconductor substrate to include a ridge portion configured to include an active layer having a quantum-cascade structure;

an embedding layer including a first portion formed on a side surface of the ridge portion, and a second portion extending from an edge portion of the first portion on a side of the semiconductor substrate along a width direction of the semiconductor substrate;

a metal layer formed on a top surface of the ridge portion, on the first portion, and on the second portion; and a dielectric layer disposed between the second portion and the metal layer, wherein the dielectric layer is formed such that a part of the second portion is exposed from the dielectric layer, the metal layer is in direct contact with the second portion at the part, wherein a thickness of the first portion of the embedding layer is thinner than a thickness of the second portion of the embedding layer.

14. The quantum-cascade laser element according to claim 13, further comprising an electrode including the metal layer, wherein:

the electrode has a portion overlapping with the part of the second portion of the embedding layer in a thickness direction of the semiconductor substrate, the active layer has a surface on a side opposite to the semiconductor substrate in the thickness direction of the semiconductor substrate, and in the thickness direction of the semiconductor substrate, a surface of the portion of the electrode is on a side opposite to the semiconductor substrate with respect to the surface of the active layer.

* * * * *